US012805094B2

(12) United States Patent
Lin et al.

(10) Patent No.: US 12,805,094 B2
(45) Date of Patent: Nov. 17, 2026

(54) SEMICONDUCTOR STRUCTURE

(71) Applicant: Q-Pixel Inc., Los Angeles, CA (US)

(72) Inventors: Chia-Feng Lin, Taichung City (TW); Yen-Ta Chen, Taichung City (TW); Jyh-Chia Chen, Yorba Linda, CA (US)

(73) Assignee: Q-Pixel Inc., Los Angeles, CA (US)

( * ) Notice: Subject to any disclaimer, the term of this patent is extended or adjusted under 35 U.S.C. 154(b) by 346 days.

(21) Appl. No.: 18/587,976

(22) Filed: Feb. 27, 2024

(65) Prior Publication Data

US 2025/0212581 A1 Jun. 26, 2025

(30) Foreign Application Priority Data

Dec. 25, 2023 (TW) ................................ 112150547

(51) Int. Cl.

*H10H 29/10* (2025.01)
*H10H 20/812* (2025.01)
*H10H 20/814* (2025.01)
*H10H 20/815* (2025.01)
*H10H 20/816* (2025.01)
*H10H 20/825* (2025.01)
*H10H 20/84* (2025.01)

(52) U.S. Cl.

CPC .......... *H10H 29/10* (2025.01); *H10H 20/812* (2025.01); *H10H 20/814* (2025.01); *H10H 20/815* (2025.01); *H10H 20/816* (2025.01); *H10H 20/825* (2025.01); *H10H 20/84* (2025.01)

(58) Field of Classification Search

CPC .... H10H 29/10; H10H 20/812; H10H 20/814; H10H 20/815; H10H 20/816; H10H 20/825; H10H 20/84; H10H 29/14; H10H 20/813; H10H 29/962

See application file for complete search history.

(56) References Cited

U.S. PATENT DOCUMENTS

2005/0082558 A1* 4/2005 Yang .................. H10H 20/8162 257/97
2019/0131343 A1* 5/2019 Templier ................. H10F 30/22
2020/0266233 A1* 8/2020 Iguchi .................. H10H 29/142
2022/0037393 A1* 2/2022 Robin .................. H10H 29/142

(Continued)

FOREIGN PATENT DOCUMENTS

TW 200525779 8/2005
TW 200719494 5/2007

(Continued)

OTHER PUBLICATIONS

"Office Action of Taiwan Counterpart Application", issued on Jul. 9, 2024, p. 1-p. 10.

*Primary Examiner* — Su C Kim
(74) *Attorney, Agent, or Firm* — JCIPRNET

(57) ABSTRACT

A semiconductor structure includes a substrate, a first type semiconductor layer, a light-emitting stack layer, and a second type semiconductor layer. The first type semiconductor layer is disposed on the substrate. The light-emitting stack layer includes a plurality of light-emitting layers stacked on the first type semiconductor layer. The plurality of light-emitting layers are configured to emit different colors of light, and wavelengths of the different colors of light fall within a range of 200 nm to 2000 nm. The second type semiconductor layer is disposed on the light-emitting stack layer.

12 Claims, 7 Drawing Sheets

1E

(56) References Cited

U.S. PATENT DOCUMENTS

| | | | | |
|---|---|---|---|---|
| 2023/0014515 A1* | 1/2023 | Kim | H10H 20/84 |
| 2023/0111615 A1* | 4/2023 | Kim | H10H 20/825 257/79 |

FOREIGN PATENT DOCUMENTS

| | | |
|---|---|---|
| TW | 200805698 | 1/2008 |
| TW | 201624760 | 7/2016 |
| TW | 202002320 | 1/2020 |
| TW | 202226633 | 7/2022 |

* cited by examiner

SEMICONDUCTOR STRUCTURE

CROSS-REFERENCE TO RELATED APPLICATION

This application claims the priority benefit of Taiwan application serial no. 112150547, filed on Dec. 25, 2023. The entirety of the above-mentioned patent application is hereby incorporated by reference herein and made a part of specification.

BACKGROUND

Technical Field

The disclosure relates to a semiconductor structure.

Description of Related Art

In a conventional light-emitting diode (LED) display panel, LEDs of multiple colors are arranged on a same plane covered with circuits (including driving components and wires) to achieve full-color display. However, as a resolution increases, the LEDs of multiple colors become closer, making the circuit excessively crowded and making it difficult to manufacture. In addition, arrangement the LEDs of multiple colors on the same plane may occupy a large area, making it difficult to improve the resolution.

SUMMARY

The disclosure provides a semiconductor structure, which helps improving resolution or save manufacturing steps.

An embodiment of the disclosure provides a semiconductor structure including a substrate, a first type semiconductor layer, a light-emitting stack layer, and a second type semiconductor layer. The first type semiconductor layer is disposed on the substrate. The light-emitting stack layer includes a plurality of light-emitting layers stacked on the first type semiconductor layer. The plurality of light-emitting layers are configured to emit different colors of light, and wavelengths of the different colors of light fall within a range of 200 nm to 2000 nm. The second type semiconductor layer is disposed on the light-emitting stack layer.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 5' is a partial schematic cross-sectional view of another semiconductor structure according to the fourth embodiment of the disclosure.

DESCRIPTION OF THE EMBODIMENTS

Directional terminology mentioned in the following embodiments, such as "top," "bottom," "left," "right," "front," "back," etc., is used with reference to the orientation of the FIG(s) being described and are not intended to limit the disclosure.

In the figures, each of the drawings depicts typical features of methods, structures, and/or materials used in the particular exemplary embodiments. However, these drawings are not to be interpreted as limiting or limiting the scope or property covered by these exemplary embodiments. For example, for clarity's sake, relative size, thickness and position of each film layer, region and/or structure may be reduced or enlarged.

In the following embodiments, the same or similar components are denoted by the same or similar referential numbers, and descriptions of the same technical contents are omitted. Moreover, the features in the different exemplary embodiments may be combined with each other in case of no confliction, and the simple equivalent changes and modifications made in accordance with the scope of the specification or the claims are still within the scope of the patent.

Furthermore, "first", "second", etc. mentioned in the specification and the claims are merely used to name discrete components and should not be regarded as limiting the upper or lower bound of the number of the components, nor is it used to define a manufacturing order or setting order of the components. In addition, one element/layer being disposed on (or above) another element/layer may encompass a situation that the element/layer is directly disposed on (or above) the other element/layer, and the two elements/layers are in direct contact, and a situation that the element/film layer is indirectly arranged on (or above) the other element/film layer, and there are one or more elements/film layers between the two elements/film layers.

Figure 1:
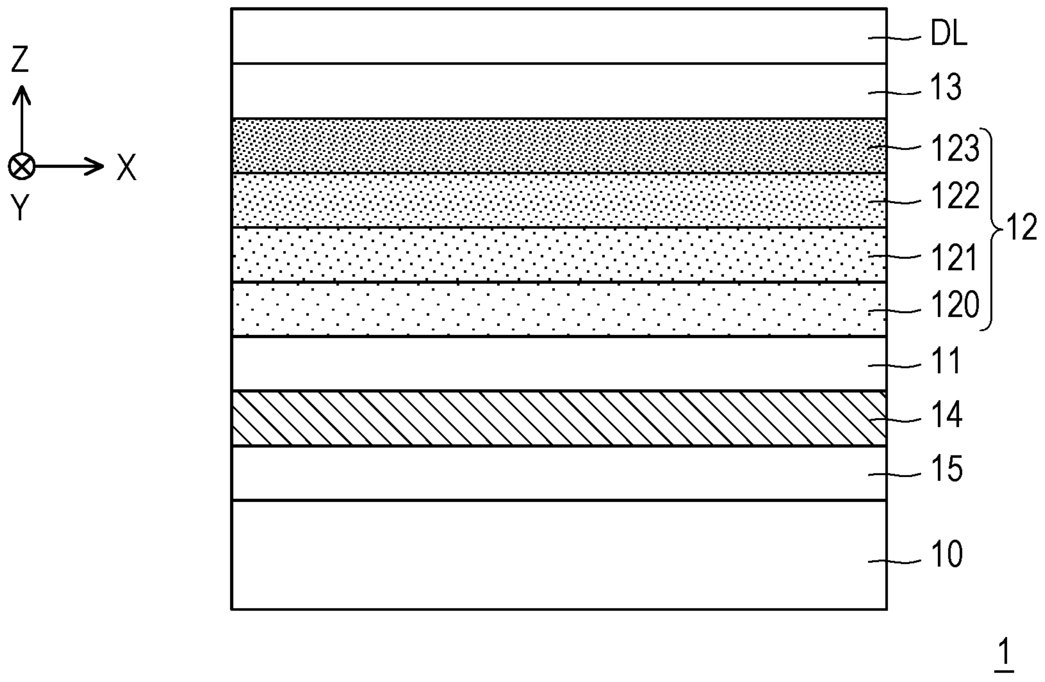
FIG. 1 is a partial schematic cross-sectional view of a semiconductor structure according to a first embodiment of the disclosure.

FIG. 1 is a partial schematic cross-sectional view of a semiconductor structure according to a first embodiment of the disclosure. Referring to FIG. 1, a semiconductor structure 1 may include a substrate 10, a first type semiconductor layer 11, a light-emitting stack layer 12, and a second type semiconductor layer 13. The first type semiconductor layer 11 is disposed on the substrate 10. The light-emitting stack layer 12 includes a plurality of light-emitting layers (for example, a light-emitting layer 120, a light-emitting layer 121, a light-emitting layer 122, and a light-emitting layer 123) stacked on the first type semiconductor layer 11. The plurality of light-emitting layers are used to emit different colors of light, and wavelengths of the different colors of light fall within a range of 200 nm to 2000 nm. The second type semiconductor layer 13 is disposed on the light-emitting stack layer 12.

Specifically, the substrate 10 is used to carry the first type semiconductor layer 11, the light-emitting stack layer 12, and the second type semiconductor layer 13. For example, a material of the substrate 10 may include sapphire ($Al_2O_3$), silicon (Si), gallium nitride (GaN), aluminum nitride (AlN), silicon carbide (SiC), gallium arsenide (GaAs), indium phosphide (InP), boron nitride (BN), graphene, a two-dimensional material, or other suitable materials, which is not limited by the disclosure.

The first type semiconductor layer 11, the light-emitting stack layer 12, and the second type semiconductor layer 13 are sequentially stacked on the substrate 10 in a direction Z, where one of the first type semiconductor layer 11 and the second type semiconductor layer 13 is an N-type semiconductor layer, and the other one of the first type semiconductor layer 11 and the second type semiconductor layer 13 is a P-type semiconductor layer. For example, the first type semiconductor layer 11 is an N-type semiconductor layer, and the second type semiconductor layer 13 is a P-type semiconductor layer. Alternatively, the first type semiconductor layer 11 is a P-type semiconductor layer, and the second type semiconductor layer 13 is an N-type semiconductor layer. A material of the first type semiconductor layer 11 and the second type semiconductor layer 13 may be any suitable material, which is not limited by the disclosure. For example, the material of the first type semiconductor layer 11 and the second type semiconductor layer 13 may include $Al_xIn_yGa_zN_{x'}As_{y'}P_{z'}$, where $0 \le x \le 1$, $0 \le y \le 1$, $0 \le z \le 1$, $0 \le x' \le 1$, $0 \le y' \le 1$, $0 \le z' \le 1$, $x+y+z=1$, and $x'+y'+z'=1$, but the disclosure is not limited thereto.

The light-emitting stack layer 12 is disposed between the first type semiconductor layer 11 and the second type semiconductor layer 13, and the plurality of light-emitting layers in the light-emitting stack layer 12 are arranged in the direction Z. In other words, the plurality of light-emitting layers in the light-emitting stack layer 12 are arranged to overlap each other in the direction Z.

FIG. 1 schematically illustrates that the light-emitting stack layer 12 includes four light-emitting layers, such as the light-emitting layer 120, the light-emitting layer 121, the light-emitting layer 122, and the light-emitting layer 123. However, it should be understood that a number of the light-emitting layers in the light-emitting stack layer 12 may be changed according to actual needs and is not limited thereto. For example, the number of the light-emitting layers in the light-emitting stack layer 12 may be more or less, such as two or more (i.e., ≥2), three or more, or more layers. When the number of light-emitting layers in the light-emitting stack layer 12 is greater than or equal to three, for example, when the light-emitting stack layer 12 includes a visible light red light-emitting layer, a green light-emitting layer, and a blue light-emitting layer, the semiconductor structure 1 may output multiple colors of light (such as red light, green light, and blue light), and may be used as a full-color light-emitting device, such as a light-emitting diode, but the disclosure is not limited thereto. An appearance and a size of the full-color light-emitting device may not be limited. For example, the appearance of the full-color light-emitting device may be granular, strip-shaped, plate-shaped, or film-shaped, etc. The size of the full-color light-emitting device may be a micron level, a millimeter level, or a sub-millimeter level, etc., but the disclosure is not limited thereto. In addition, an application of the full-color light-emitting devices is not limited. For example, the full-color light-emitting devices may be arranged in an array to be used in a light source module or a display device (for example, serving as a pixel array), but the disclosure is not limited thereto.

In FIG. 1, the light-emitting layer 120, the light-emitting layer 121, the light-emitting layer 122, and the light-emitting layer 123 are, for example, respectively an ultraviolet light-emitting layer, a blue light-emitting layer, a green light-emitting layer, and a red light-emitting layer. However, it should be understood that the color types and/or the stacking order of the multiple light-emitting layers in the light-emitting stack layer 12 may be changed according to actual needs and are not limited thereto.

Materials of the multiple light-emitting layers in the light-emitting stack layer 12 may include group III and V materials, and any one of the light-emitting layers may be a multiple quantum well (MQW) layer. For example, the red light-emitting layer, the green light-emitting layer, the blue light-emitting layer, and the ultraviolet light-emitting layer may all be MQW layer. Any one of the red light-emitting layer, the green light-emitting layer, and the blue light-emitting layer may be an alternating stack of multiple layers of aluminum indium gallium nitride ($In_xGa_yAl_zN$) layers and multiple layers of aluminum indium gallium nitride ($In_{x'}Ga_{y'}Al_{z'}N$) layers, and the ultraviolet light-emitting layer may be an alternating stack of multiple layers of aluminum indium gallium nitride ($In_xGa_yAl_zN$) layers and multiple layers of aluminum indium gallium nitride ($In_{x'}Ga_{y'}Al_{z'}N$) layers, but the disclosure is not limited thereto. In the red light-emitting layer, $0.33 \le x \le 0.6$ and $x+y+z=1$, in the green light-emitting layer, $0.25 \le x \le 0.35$ and $x+y+z=1$, in the blue light-emitting layer, $0.15 \le x \le 0.3$ and $x+y+z=1$; in the ultraviolet light-emitting layer, $0.01 \le x \le 0.15$ and $x+y+z=1$, and in a barrier layer, $x'+y'+z'=1$. However, the disclosure is not limited thereto.

According to different requirements, the semiconductor structure 1 may further include other components or film layers. Taking FIG. 1 as an example, the semiconductor structure 1 may further include a reflective layer 14 to improve light-emitting efficiency or implement single side (e.g., an upper side of the semiconductor structure 1 in FIG. 1) light emission, but the disclosure is not limited thereto. The reflective layer 14 is disposed between the substrate 10 and the first type semiconductor layer 11. For example, the reflective layer 14 may be a distributed Bragg reflector (DBR), but the disclosure is not limited thereto. The DBR is, for example, an alternating stack layer of multiple layers of aluminum nitride (AlN) and multiple layers of gallium nitride (GaN). In other embodiments, the reflective layer 14 may be a stress control layer, and the reflective layer 14 may be an alternating stack layer of multiple layers of porous aluminum indium gallium nitride ($Al_uGa_vIn_wN$) layers and multiple layers of aluminum indium gallium nitride ($Al_uGa_vIn_wN$) layers. In still some embodiments, the reflective layer 14 may be a sacrificial layer, and the reflective layer 14 may be an etching-stripping sacrificial layer of multiple layers of porous aluminum indium gallium nitride ($Al_uGa_vIn_wN$). In still other embodiments, the reflective layer 14 may be a structural weakening layer, and the reflective layer 14 may be a structural weakening structure including multiple layers of porous aluminum indium gallium nitride ($Al_uGa_vIn_wN$). In the above aluminum indium gallium nitride ($Al_uGa_vIn_wN$), $u+v+w=1$, but the disclosure is not limited thereto. In other embodiments that are not shown, the reflective layer 14 may be omitted.

In some embodiments, the semiconductor structure 1 may further include a buffer layer 15 to mitigate a lattice constant mismatch problem. The buffer layer 15 is disposed between the substrate 10 and the first type semiconductor layer 11. In a framework where the semiconductor structure 1 includes the reflective layer 14, the buffer layer 15 is, for example, disposed between the substrate 10 and the reflective layer 14. For example, a material of the buffer layer 15 may include an undoped gallium nitride layer. Alternatively, the material of the buffer layer 15 may include multiple layers of thin film structures with different elemental compositions of aluminum indium gallium nitride (AlInGaN) layers doped with high concentration silicon, but the disclosure is not limited thereto. In some other embodiments, the buffer layer 15 may be omitted.

In some embodiments, the semiconductor structure 1 may further include a dielectric film DL. The dielectric film DL may be a single-layer film or a multi-layer film, and a material of the dielectric film DL may include $SiO_2$, $TiO_2$, $Si_3N_4$, $Ta_2O_5$, etc., but the disclosure is not limited thereto. The dielectric film DL may be used as a coating layer or a reflector structure, such as a DBR formed by alternately stacking multiple layers of $TiO_2$ and multiple layers of $SiO_2$.

In some embodiments, although not shown, the semiconductor structure 1 may also include a plurality of electrodes, such as a cathode and an anode, where the cathode is electrically connected to the N-type semiconductor layer (for example, the first type semiconductor layer 11), and the anode is electrically connected to the P-type semiconductor layer (for example, the second type semiconductor layer 13). The cathode and the anode are made of conductive materials. The conductive material may include transparent conductive materials (such as metal oxides, graphene, two-dimensional materials, etc.) or non-transparent conductive materials (such as metals or alloys, etc.). Top-view shapes of the cathode and the anode are not limited. For example, the top-view shapes of the cathode and the anode may be blocks, strip, sheets, frames, rings, or irregular shapes. Furthermore, the cathode and anode may have the same or different top-view shapes.

By controlling a voltage difference between the cathode and the anode, a color of the light output from the semiconductor structure 1 may be controlled. For example, when the voltage difference between the cathode and the anode is greater than a first value, the semiconductor structure 1 outputs first color light. When the voltage difference between the cathode and the anode is greater than a second value, the semiconductor structure 1 outputs second color light. When the voltage difference between the cathode and the anode is greater than a third value, the semiconductor structure 1 outputs third color light. When the voltage difference between the cathode and the anode is greater than a fourth value, the semiconductor structure 1 outputs fourth color light. The first to fourth values are different, and wavelengths/colors of the first to fourth color lights are different. For example, the first to fourth values are between 0 volt (V) and 20 volts, and the first to fourth color lights are, for example, red light, green light, blue light, and UV light respectively, and a DC voltage, a pulse voltage, an AC voltage, a pulse current, etc., may be used, but the disclosure is not limited thereto.

Each of the first value to the fourth value may vary according to factors such as selected materials and process parameters. For example, in an embodiment where the light-emitting layer adopts an indium phosphide-based material, the first value is, for example, 1.5 volts. In an embodiment where the light-emitting layer adopts a gallium arsenide-based material, the first value is, for example, 2 volts. In an embodiment where the light-emitting layer adopts a gallium nitride-based material, the first value is, for example, 3 volts. It should be understood that the above-mentioned first value is only an example and is not used to limit the disclosure.

In some embodiments, as the voltage difference between the cathode and the anode increases, the light output by the semiconductor structure 1 may be converted from red light to green light, from green light to blue light, and from blue light to UV Light. In some embodiments, an ultraviolet light-emitting layer may be used as a stress relief layer, or as a color conversion light source of photoresist phosphor and quantum dot materials, and the ultraviolet light-emitting layer may be made not to emit light by controlling the voltage difference.

Compared with arranging multiple light-emitting layers on a same plane (for example, an XY plane formed by a direction X and a direction Y) and arranging multiple electrode groups corresponding to the multiple light-emitting layers (each electrode group includes a cathode and an anode), the design of the light-emitting stack layer 12 used in the embodiment may occupy a smaller area and save the number of used electrode groups, thereby helping to improve resolution, achieve miniaturization, or simplifying the manufacturing process.

Figure 2:
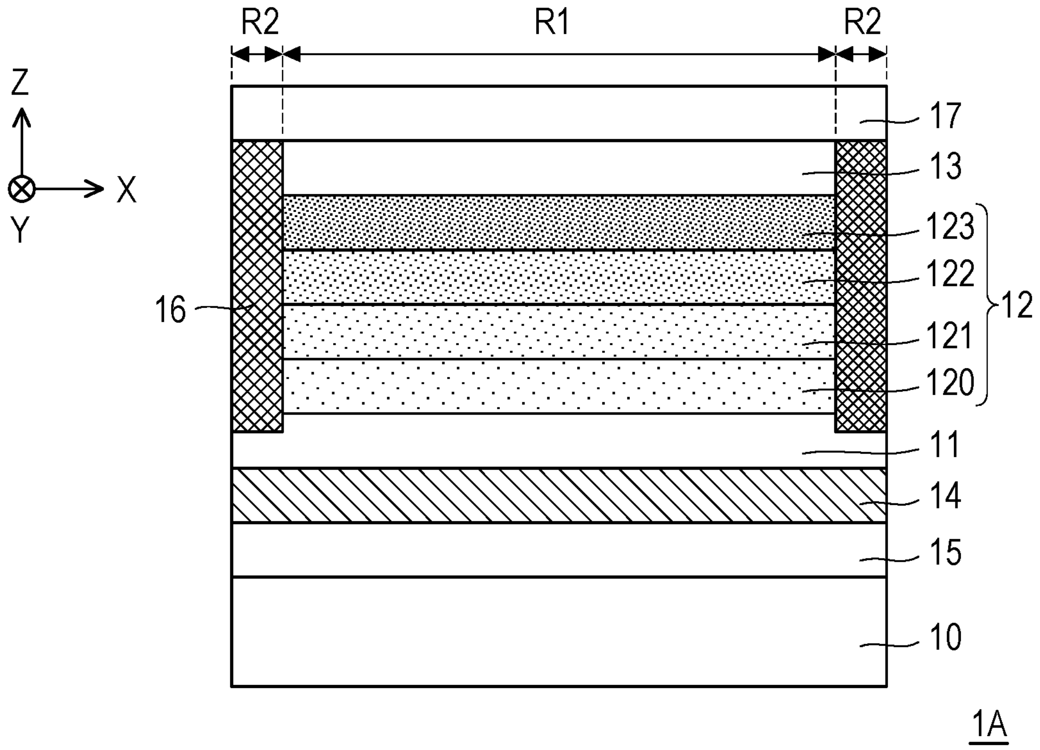
FIG. 2 is a partial schematic cross-sectional view of a semiconductor structure according to a second embodiment of the disclosure.

FIG. 2 is a partial schematic cross-sectional view of a semiconductor structure according to a second embodiment of the disclosure. Referring to FIG. 2, main differences between a semiconductor structure 1A and the semiconductor structure 1 of FIG. 1 are described in the following paragraphs. The semiconductor structure 1A has a light-emitting region R1 and a peripheral region R2 surrounding the light-emitting region R1, and the semiconductor structure 1A further includes a first insulator 16. The first insulator 16 is disposed in the peripheral region R2, where the first insulator 16 extends from the second type semiconductor layer 13 into the first type semiconductor layer 11, and the first insulator 16 may absorb light of different colors emitted by multiple light-emitting layers.

In a framework of a single micro LED, the first insulator 16 may be used to absorb large-angle light or mitigate side light leakage, which helps to control a light emission angle of the semiconductor structure 1A, and cooperates with the reflective layer 14 to achieve unilateral light emission, narrow a light divergence angle, and improve light-emitting efficiency.

Under a framework of a micro LED array, for example, when the semiconductor structure 1A includes a plurality of light-emitting regions R1, and the plurality of light-emitting regions R1 are, for example, arranged in an array in the direction X and the direction Y, the multiple light-emitting regions R1 may be separated by the first insulator 16, so that the second type semiconductor layer 13 in each light-emitting region R1 may maintain independent electrical properties. At the same time, the first insulator 16 may be used to absorb side light leakage, so that problems of light mixing and optical crosstalk caused by the side light leakage are mitigated.

In some embodiments, the first insulator 16 may be formed through ion implantation, ion bombardment, oxidation, and diffusion, where the ion implantation may adopt As, P, Mg, $BF_2$, or other ion sources with atomic weight/molecular weight greater than or equal to 30 a.m.u., but the disclosure is not limited thereto. In other embodiments, the first insulator 16 may be formed by forming a platform portion through a patterning process and then filling a gap (i.e., a portion removed by the patterning process) next to the platform portion with a light-shielding material (such as a black matrix or other light-absorbing materials).

The first insulator 16 is formed by performing ion implantation or ion bombardment on the second type semiconductor layer 13, the light-emitting stack layer 12, and partial first type semiconductor layer 11 in the peripheral region R2. A surface resistance of the first insulator 16 in the peripheral region R2 is, for example, more than 2 times, such as 10 times of a surface resistance of any one of the first type semiconductor layer 11, the light-emitting stack layer 12, and the second type semiconductor layer 13 in the light-emitting region R1. Further, by forming the first insulator 16 in the above manner, in addition to saving a space to achieve miniaturization, the patterning process may be omitted, which helps simplifying a manufacturing process and maintaining surface flatness.

In some embodiments, the semiconductor structure 1A may further include a current diffusion layer 17. The current diffusion layer 17 is disposed on the second type semiconductor layer 13 and may electrically connect the anode (not shown) to the second type semiconductor layer 13. The current diffusion layer 17 may be a light-transmissive conductive layer to reduce shielding of light from the light-emitting stack layer 12. For example, a material of the current diffusion layer 17 may include metal oxide, graphene, other suitable transparent conductive materials, or a combination thereof. The metal oxides may include indium tin oxide, indium zinc oxide, aluminum tin oxide, aluminum zinc oxide, indium germanium zinc oxide, or other metal oxides.

In some embodiments, the current diffusion layer 17 may be further disposed on the first insulator 16. Optionally, a side wall of the current diffusion layer 17 may be aligned with a side wall of the first insulator 16, but the disclosure is not limited thereto. For example, in a framework of a micro LED array, although not shown in FIG. 2, the current diffusion layer 17 may not be disposed on the first insulator 16 (referring to FIG. 7) or may be disposed on only a part of the first insulator 16 to maintain independent electrical properties of the second type semiconductor layer 13.

Although FIG. 2 shows the first insulator 16 and the current diffusion layer 17 being provided in a four-layer light-emitting layer structure, it should be understood that the number of the light-emitting layers may be increased or decreased according to actual needs, and the following embodiments may also be changed according to the description in this paragraph, and description thereof is not repeated in the following paragraphs.

Figure 3:
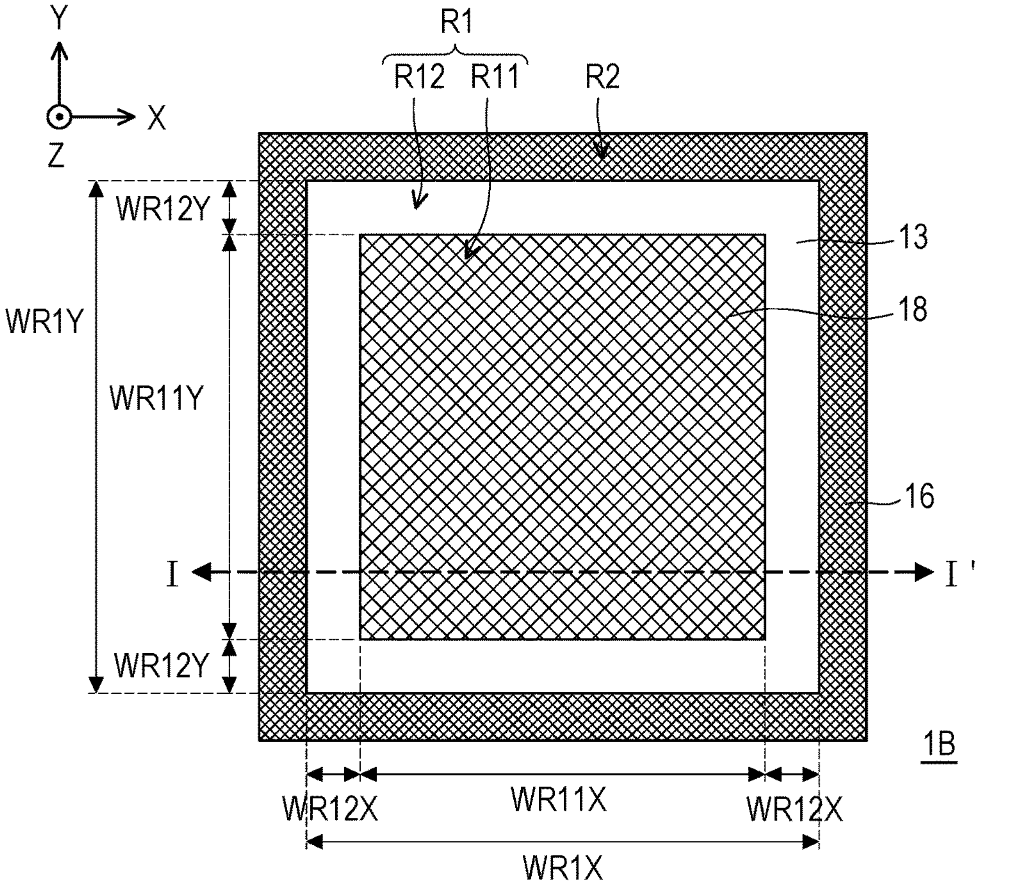
FIG. 3 is a partial schematic top view of a semiconductor structure according to a third embodiment of the disclosure.
Figure 4:
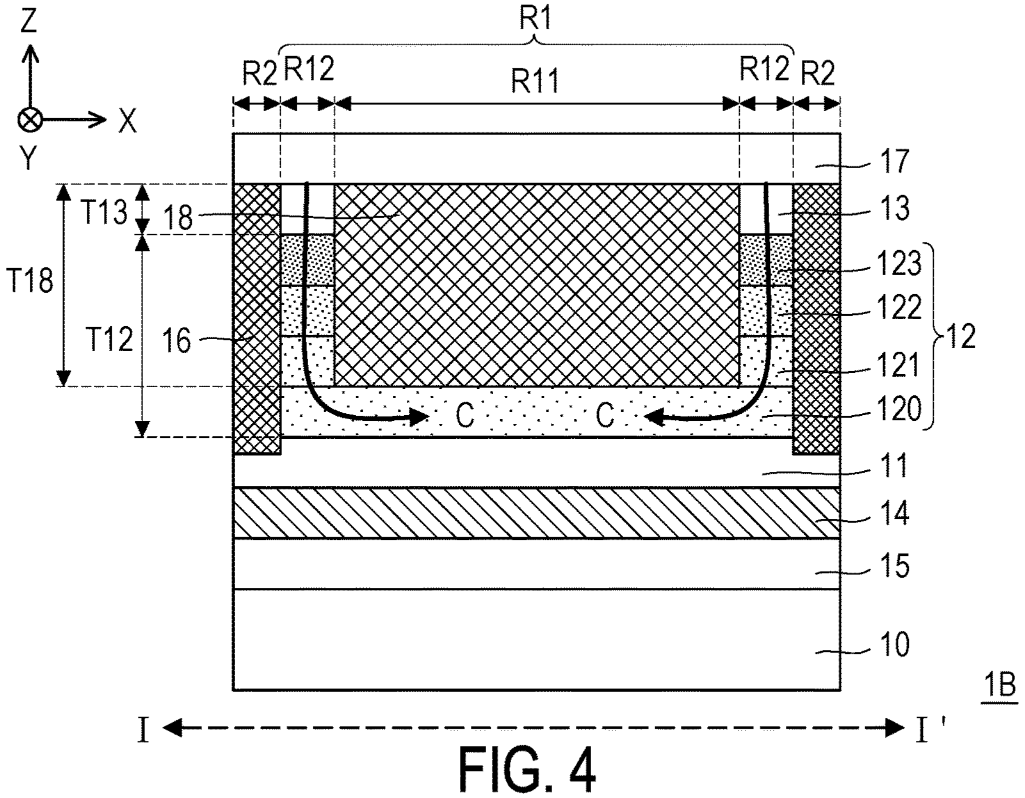
FIG. 4 is a schematic cross-sectional view corresponding to a section line I-I' in FIG. 3.

FIG. 3 is a partial schematic top view of a semiconductor structure according to a third embodiment of the disclosure. FIG. 4 is a schematic cross-sectional view corresponding to a section line I-I' in FIG. 3. Referring to FIG. 3 and FIG. 4, main differences between a semiconductor structure 1B and the semiconductor structure 1A of FIG. 2 are described in the following paragraphs. The semiconductor structure 1B further includes a second insulator 18. The second insulator 18 is disposed in the light-emitting region R1, where the second insulator 18 extends from the second type semiconductor layer 13 to the light-emitting stack layer 12, and the second insulator 18 may allow different colors of light emitted by multiple light-emitting layers (including the light-emitting layer 120 to the light-emitting layer 123) to pass through. In other words, the second insulator 18 is light-transmissive.

In some embodiments, the second insulator 18 may be formed through ion implantation, ion bombardment, or oxidation, where the ion implantation may adopt H, He, B, C, N, O, or other ion sources with atomic weight/molecular weight smaller than or equal to 30 a.m.u., but the disclosure is not limited thereto. A shape of the second insulator 18 may be changed according to a device size, and the second insulator 18 may be completely or partially transparent and insulating.

The second insulator 18 is formed by performing ion implantation or ion bombardment on the local second type semiconductor layer 13 in the light-emitting region R1 (for example, the second type semiconductor layer 13 in a sub-region R11) and at least one of the light-emitting layers in the light-emitting stack layer 12 thereunder. A surface resistance of the second insulator 18 is, for example, 1.5 times or more, for example, 2 times or more of a surface resistance of any one of the light-emitting stack layer 12 and the second type semiconductor layer 13 in the light-emitting region R1.

In addition, a thickness T18 of the second insulator 18 is less than a sum of thicknesses of the second type semiconductor layer 13 and the light-emitting stack layer 12 (i.e., a thickness T13 plus a thickness T12), i.e., T18<(T13+T12). In FIG. 4, the thickness T18 of the second insulator 18 is equal to a sum of thicknesses of the second type semiconductor layer 13, the light-emitting layer 123, the light-emitting layer 122, and the light-emitting layer 121, but the disclosure is not limited thereto. In other embodiments, although not shown, the thickness T18 of the second insulator 18 may be equal to the sum of the thicknesses of the second type semiconductor layer 13, the light-emitting layer 123, and the light-emitting layer 122, or equal to the sum of the thicknesses of the second type semiconductor layer 13 and the light-emitting layer 123.

In the light-emitting region R1, the second insulator 18 is, for example, located in a center of the light-emitting region R1 and overlaps the sub-region R11 of the light-emitting region R1, and the second insulator 18 exposes a sub-region R12 of the light-emitting region R1. In other words, the second insulator 18 does not overlap the sub-region R12. Since a resistance value of the region where the second insulator 18 is located is higher than a resistance value of the region outside the second insulator 18, a current C may be injected from a periphery of the light-emitting region R1 (the sub-region R12) and flow laterally into the light-emitting layer under the second insulator 18 (such as the light-emitting layer 120). Taking FIG. 4 as an example, as a voltage difference increases, the multiple light-emitting layers (such as the light-emitting layer 123, the light-emitting layer 122, the light-emitting layer 121, and the light-emitting layer 120) in the sub-region R12 may sequentially emit red light, green light, blue light, and UV light, and the light-emitting layer 120 in the sub-region R11 may emit UV light.

Since the region replaced by the second insulator 18 in the light-emitting stack layer does not emit light, light intensity of each color light may be adjusted through a thickness and/or area design of the second insulator 18, for example, the light intensity of each color light may be adjusted to be consistent or the light intensity of some colors of light is adjusted to be much lower than the light intensity of other colors of light. In addition, by arranging the second insulator 18 in the light-emitting region R1 (i.e., reducing an area of a current channel), a current density in the sub-region R12 may be increased, which helps to reduce the voltage difference that allows the light-emitting layer to emit light. In some embodiments, the second insulator 18 may be a patterned array, and the current C is injected from the current diffusion layer 17 to light up the underlying light-emitting layer.

In some embodiments, as shown in FIG. 3, shapes of the semiconductor structure 1B and the sub-region R11 may be quadrilaterals, but the disclosure is not limited thereto. In other embodiments, the shapes of the semiconductor structure 1B and the sub-region R11 may be circles, triangles or other polygonal shapes, and the shapes of the semiconductor structure 1B and the sub-region R11 may be the same or different.

In addition, a width WR11X of the sub-region R11 in the direction X may be greater than 0 and smaller than a width WR1X of the light-emitting region R1 in the direction X, and a width WR11Y of the sub-region R11 in the direction Y may be greater than 0 and smaller than a width WR1Y of the light-emitting region R1 in the direction Y. The width WR11X may be the same as or different from the width WR11Y, and the width WR1X may be the same as or different from the width WR1Y. Similarly, a width WR12X of the sub-region R12 in the direction X may be greater than 0 and smaller than the width WR1X of the light-emitting region R1 in the direction X, and a width WR12Y of the sub-region R12 in the direction Y may be greater than 0 and smaller than the width WR1Y of the light-emitting region R1 in the direction Y. The width WR12X may be the same as or different from the width WR12Y. In some embodiments, a ratio of the width WR11X to the width WR12X may be 1:2, and a ratio of the width WR11Y to the width WR12Y may be 1:2, so that the light intensity of each color light is consistent, but the disclosure is not limited thereto.

Figure 5:
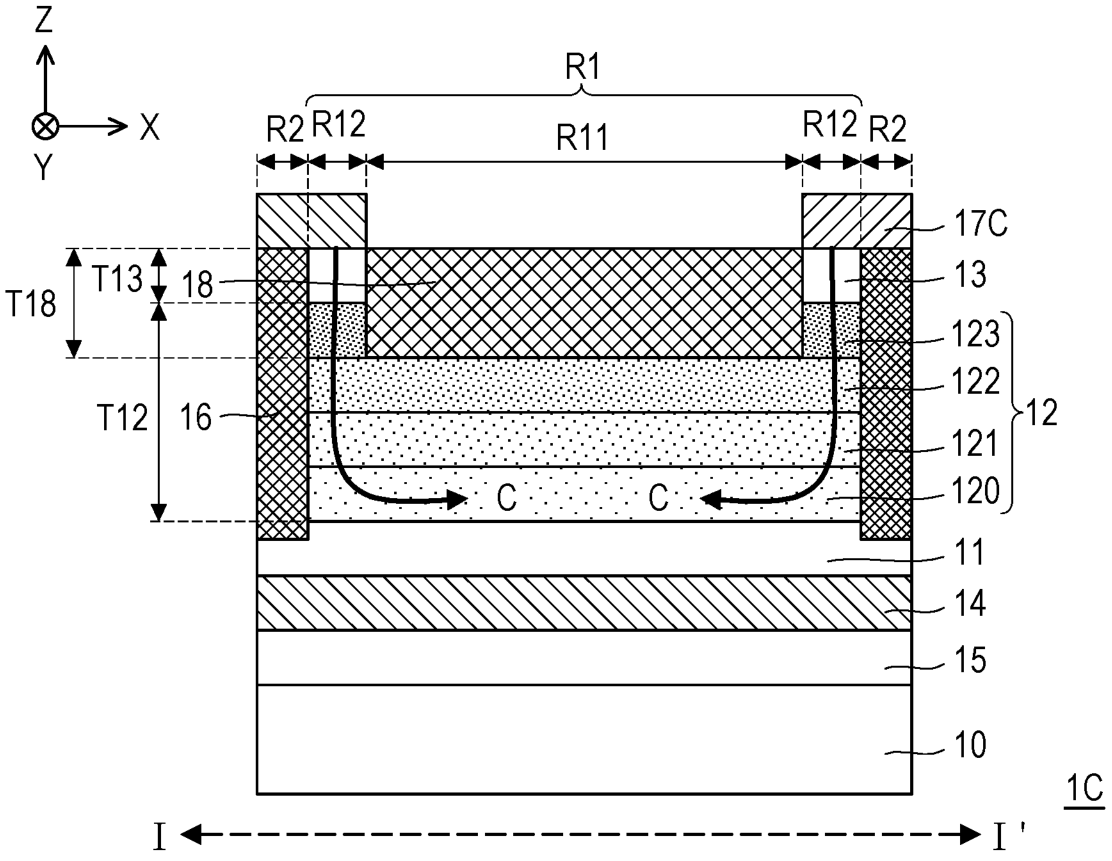
FIG. 5 is a partial schematic cross-sectional view of a semiconductor structure according to a fourth embodiment of the disclosure.
Figure 5:
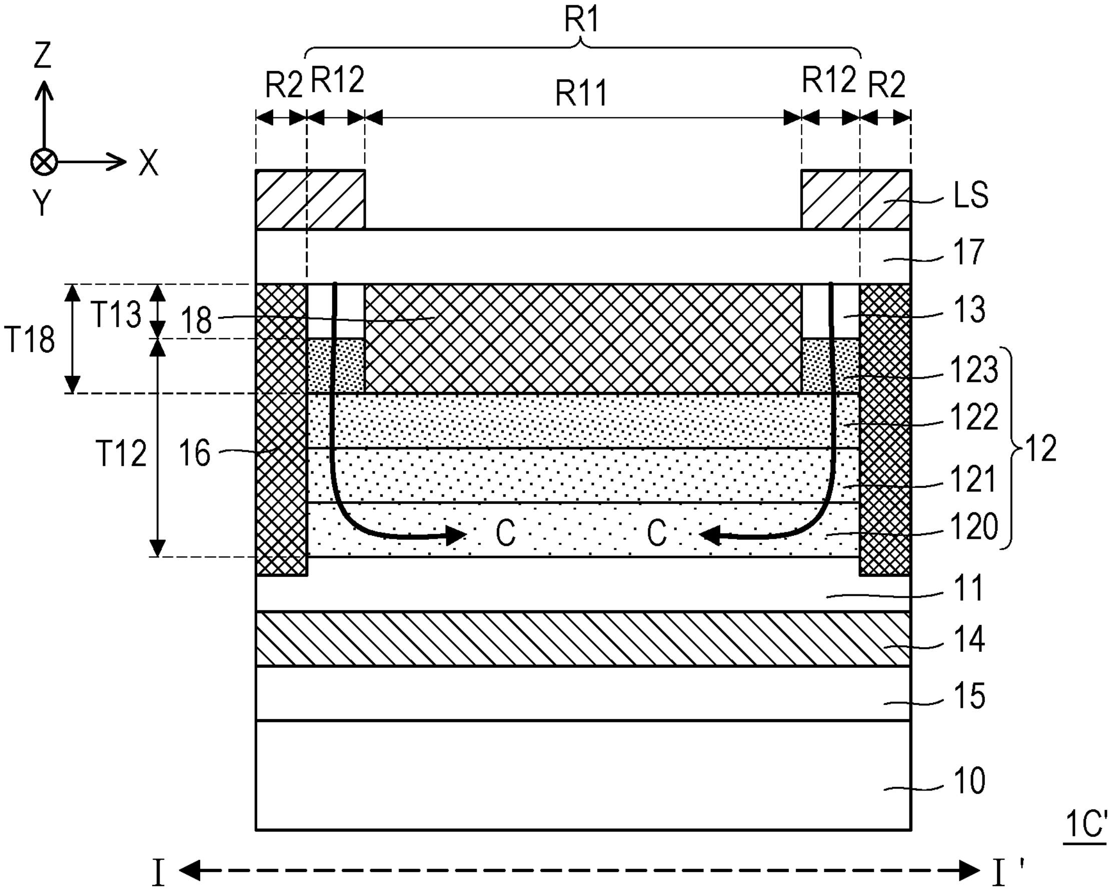

FIG. 5 is a partial schematic cross-sectional view of a semiconductor structure according to a fourth embodiment of the disclosure. Referring to FIG. 5, main differences between the semiconductor structure 1C and the semiconductor structure 1B of FIG. 4 are described in the following paragraphs. In the semiconductor structure 1C, the thickness T18 of the second insulator 18 is equal to the sum of the thicknesses of the second type semiconductor layer 13 and the light-emitting layer 123. Therefore, as the voltage difference increases, the multiple light-emitting layers (such as the light-emitting layer 122, the light-emitting layer 121 and the light-emitting layer 120) in the sub-region R11 may sequentially emit green light, blue light, and UV light. In addition, a current diffusion layer 17C is, for example, a light-shielding conductive layer (such as a metal layer), and the current diffusion layer 17C exposes the second insulator 18 to reduce the shielding of the light emitted from the light-emitting layer.

By arranging the current diffusion layer 17C with a light-shielding property on the second type semiconductor layer 13, i.e., the current diffusion layer 17C overlaps the sub-region R12, the light emitted from the sub-region R12 may be shielded, thus helping to control a waveband of the light output from the semiconductor structure 1C or change a light shape thereof, including near, mid-field, and far-field light shapes, and such design may be used in collaboration with optical lenses.

FIG. 5' is a partial schematic cross-sectional view of another semiconductor structure according to the fourth embodiment of the disclosure. Referring to FIG. 5', main differences between a semiconductor structure 1C' and the semiconductor structure 1B of FIG. 4 are described in the following paragraphs. The semiconductor structure 1C' further includes a light-shielding layer LS, where the light-shielding layer LS is disposed on a portion of the current diffusion layer 17 and exposes the second insulator 18. The light-shielding layer LS may be formed of a black photoresist material, metal or other light-shielding materials.

By disposing the light-shielding layer LS on the second type semiconductor layer 13, i.e., the light-shielding layer LS overlaps the sub-region R12, and the light emitted from the sub-region R12 may be shielded, thus helping to control a waveband of the light output from the semiconductor structure 1C' or change a light shape thereof, including near, mid-field, and far-field light shapes, and such design may also be used in collaboration with optical lenses.

Figure 6:
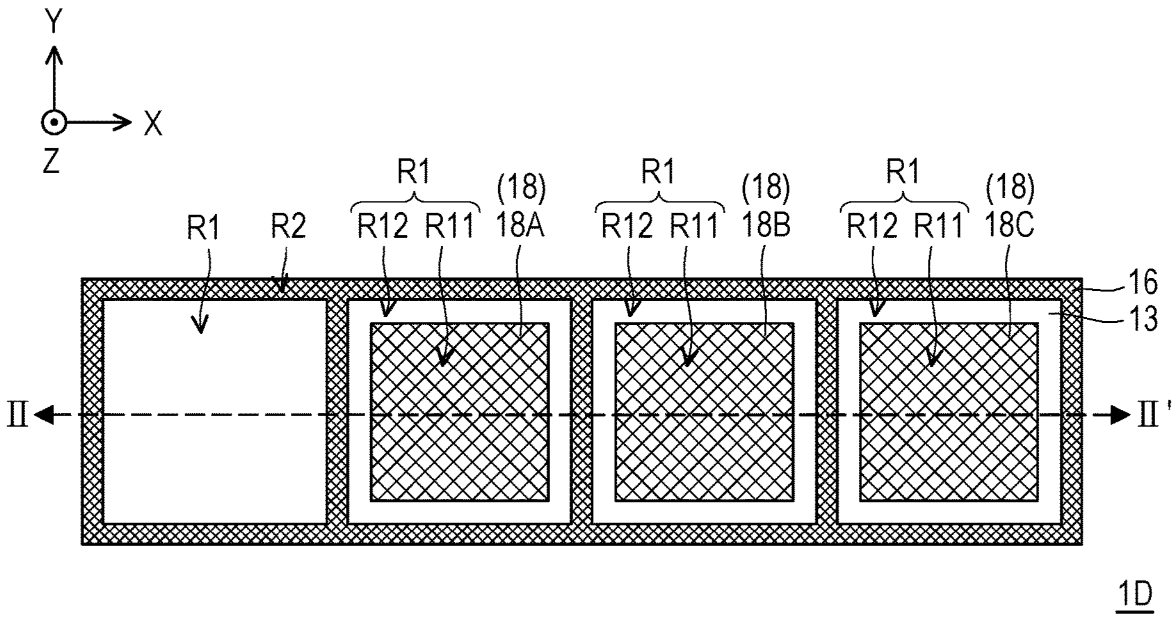
FIG. 6 is a partial schematic top view of a semiconductor structure according to a fifth embodiment of the disclosure.
Figure 7:
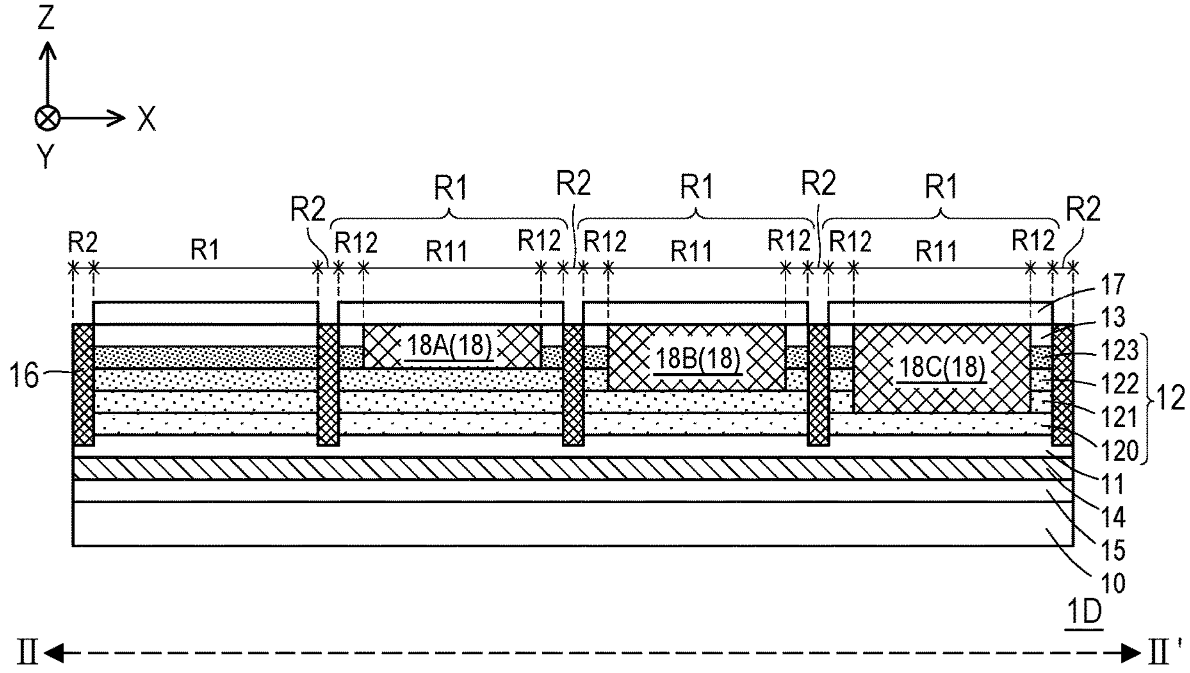
FIG. 7 is a schematic cross-sectional view corresponding to a section line II-II' in FIG. 6.

FIG. 6 is a partial schematic top view of a semiconductor structure according to a fifth embodiment of the disclosure. FIG. 7 is a schematic cross-sectional view corresponding to a section line II-II' in FIG. 6. Referring to FIG. 6 and FIG. 7, main differences between a semiconductor structure 1D and the semiconductor structure 1B of FIG. 3 and FIG. 4 are described in the following paragraphs. The semiconductor structure 1D has a plurality of light-emitting regions R1, and the second insulator 18 is disposed in at least one of the plurality of light-emitting regions R1.

Taking FIG. 6 and FIG. 7 as an example, the plurality of light-emitting regions R1 are, for example, arranged in the direction X, but the disclosure is not limited thereto. In other embodiments that are not shown, the plurality of light-emitting regions R1 may be arranged in the direction Y, or the plurality of light-emitting regions R1 may be arranged in an array in the direction X and the direction Y.

The semiconductor structure 1D may include a plurality of second insulators 18. FIG. 6 and FIG. 7 schematically illustrate three second insulators 18, such as a second insulator 18A, a second insulator 18B and a second insulator 18C. The second insulator 18A, the second insulator 18B, and the second insulator 18C are located in three sub-regions R11 of three light-emitting regions R1. The second insulator 18A, the second insulator 18B, and the second insulator 18C have different thicknesses, but the disclosure is not limited thereto. For example, in other non-illustrated embodiments, one or more second insulators 18 may be provided in each light-emitting region R1, and the thicknesses of the multiple second insulators 18 in the multiple light-emitting regions R1 may be the same or different.

Figure 8:
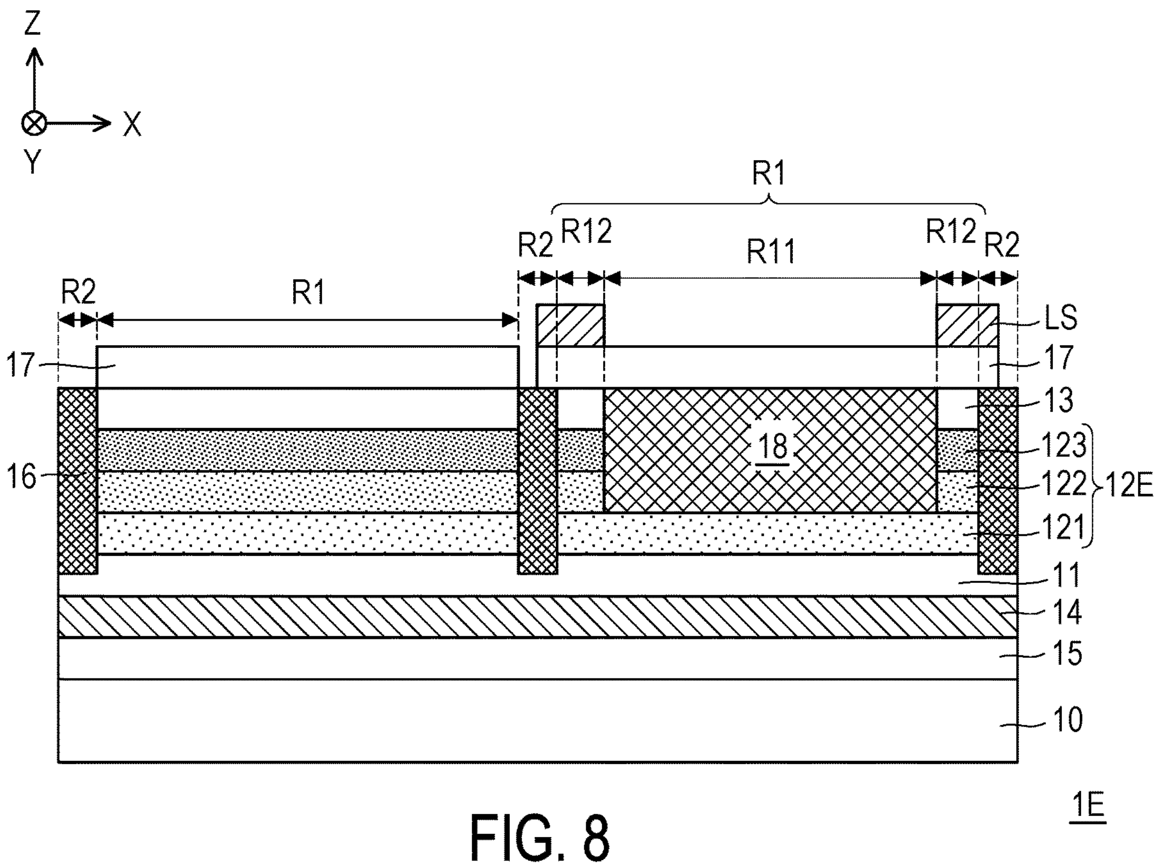
FIG. 8 is a partial schematic cross-sectional view of a semiconductor structure according to a sixth embodiment of the disclosure.

FIG. 8 is a partial schematic cross-sectional view of a semiconductor structure according to a sixth embodiment of the disclosure. Referring to FIG. 8, main differences between a semiconductor structure 1E and the semiconductor structure 1D of FIG. 7 are described in the following paragraphs. The semiconductor structure 1E further includes a light-shielding layer LS disposed on a part of the current diffusion layer 17. The light-shielding layer LS may be formed of a black photoresist material, metal or other light-shielding materials. In addition, a light-emitting stack layer 12E includes the light-emitting layer 121, the light-emitting layer 122, and the light-emitting layer 123, and does not include the light-emitting layer 120. Under such framework, as the voltage difference increases, the multiple light-emitting layers (such as the light-emitting layer 123, the light-emitting layer 122 and the light-emitting layer 121) in the left light-emitting region R1 may sequentially emit red light, green light, and blue light, and the light-emitting layer 121 in the sub-region R11 may emit blue light.

Figure 9:
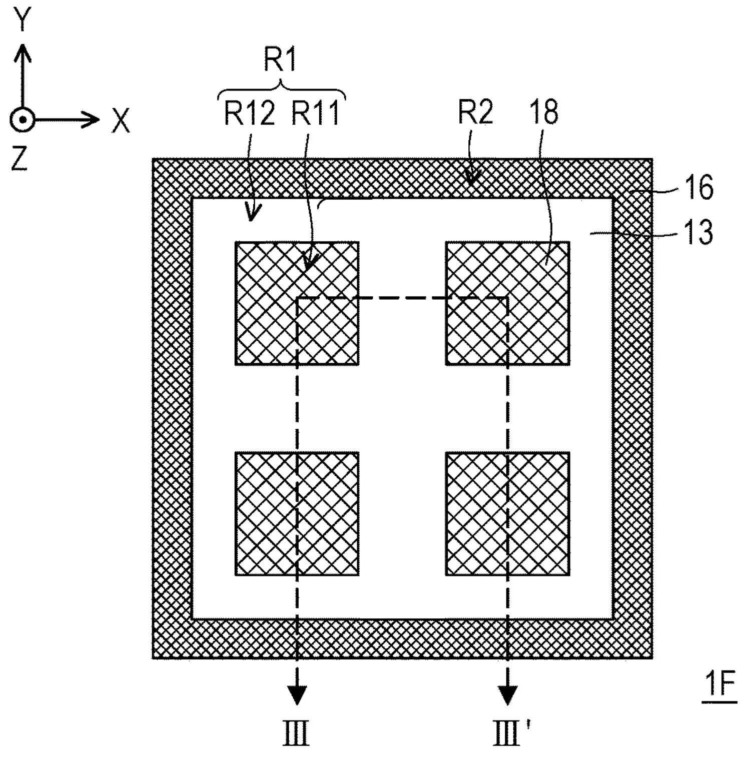
FIG. 9 is a partial schematic top view of a semiconductor structure according to a seventh embodiment of the disclosure.
Figure 10:
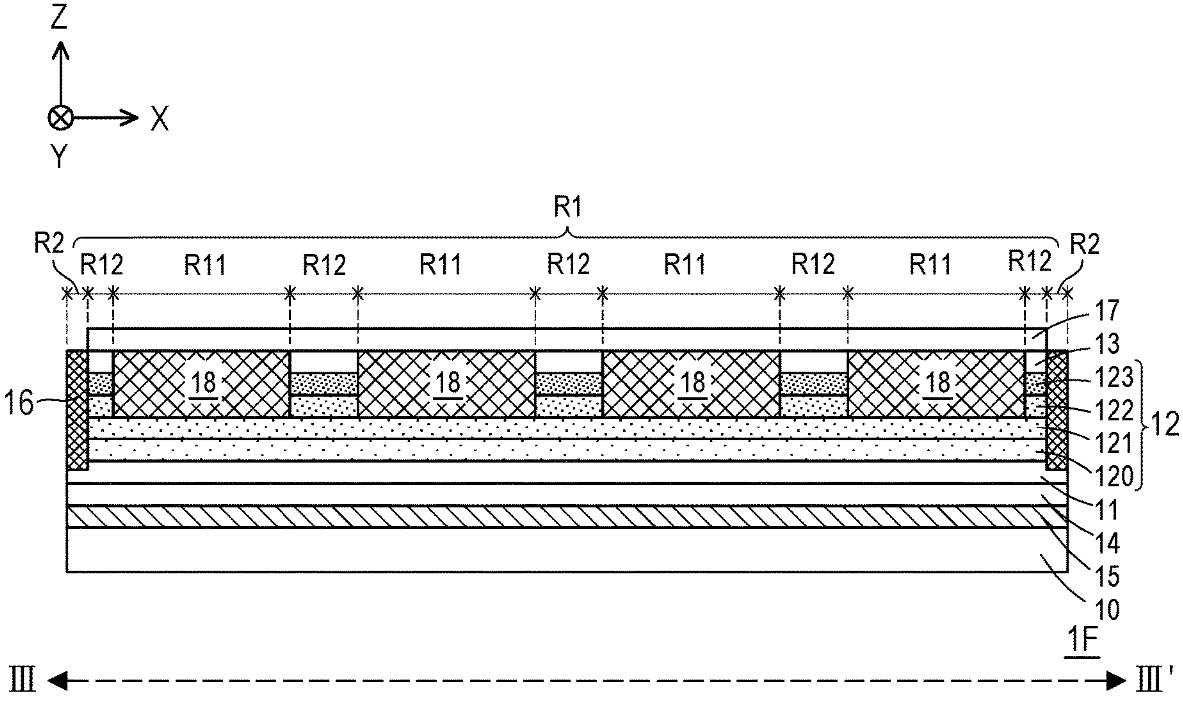
FIG. 10 and FIG. 11 are two schematic cross-sectional views corresponding to a section line III-III' in FIG. 9.
Figure 11:
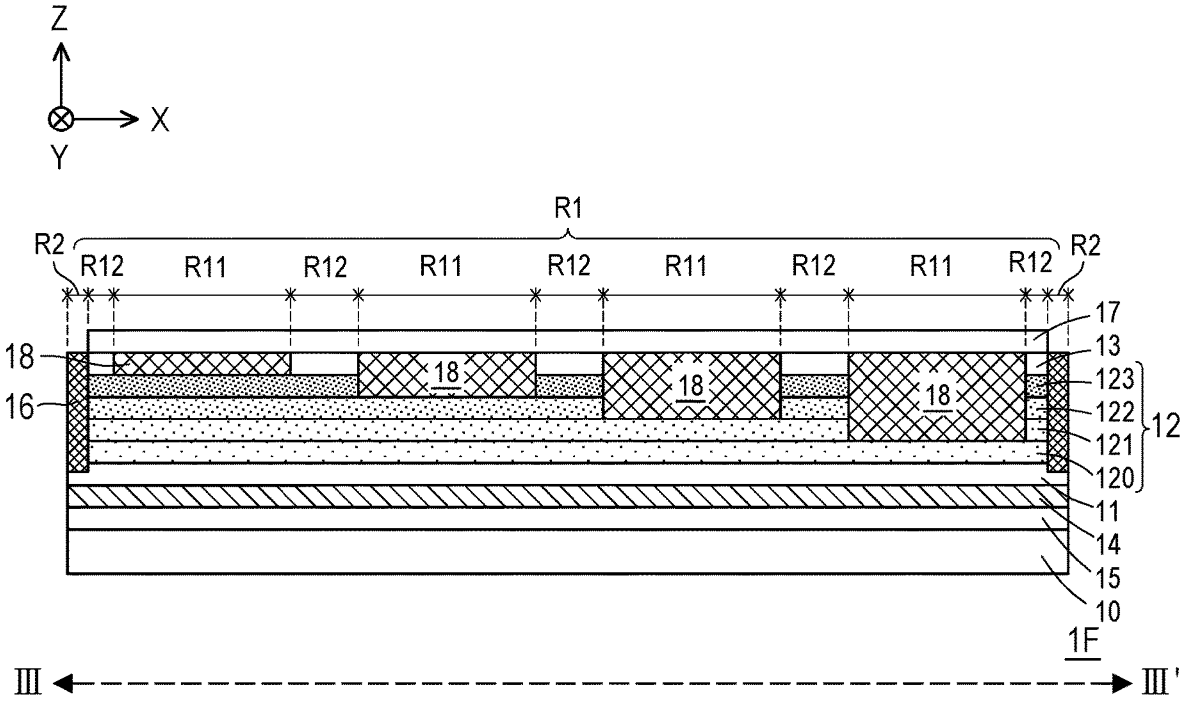

FIG. 9 is a partial schematic top view of a semiconductor structure according to a seventh embodiment of the disclosure. FIG. 10 and FIG. 11 are two schematic cross-sectional views corresponding to a section line III-III' in FIG. 9. Referring to FIG. 9 to FIG. 11, main differences between a semiconductor structure 1F and the semiconductor structure 1D of FIG. 6 and FIG. 7 are described in the following paragraphs. In the semiconductor structure 1F, the light-emitting region R1 includes four sub-regions R11 and a sub-region R12 surrounding the four sub-regions R11. The semiconductor structure 1F includes a plurality of second insulators 18 (four are schematically shown), and the light-emitting region R1 is provided with a plurality of second insulators 18. In some embodiments, as shown in FIG. 9, the plurality of second insulators 18 may have a same thickness. In other embodiments, as shown in FIG. 10, the plurality of second insulators 18 may have different thicknesses.

Although FIG. 9 to FIG. 11 schematically illustrate only one light-emitting region R1, the semiconductor structure 1F may also include a plurality of light-emitting regions R1, and the plurality of light-emitting regions R1 may have the same or different designs. In addition, each of the plurality of light-emitting regions R1 may be provided with one or a plurality of second insulators 18 or may not be provided with any second insulator 18, and when the light-emitting region R1 is provided with a plurality of second insulators 18, thicknesses of the plurality of second insulators 18 may be the same or different.

It should be noted that features in several different embodiments of may be replaced, reorganized, and mixed to complete other embodiments without departing from the spirit of the disclosure. Features in various embodiments may be mixed and matched as long as they do not violate the spirit of the disclosure or conflict with each other.

In summary, in the embodiments of the invention, the design of the semiconductor structure using the light-emitting stack layer may occupy a smaller area and save the number of the used electrode groups, thereby helping to improve resolution, achieve miniaturization or simplifying the manufacturing process.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A semiconductor structure, comprising:

a substrate;

a first type semiconductor layer, disposed on the substrate;

a light-emitting stack layer, comprising a plurality of light-emitting layers stacked on the first type semiconductor layer, wherein the plurality of light-emitting layers are configured to emit different colors of light, and wavelengths of the different colors of light fall within a range of 200 nm to 2000 nm; and a second type semiconductor layer, disposed on the light-emitting stack layer, wherein the semiconductor structure has a light-emitting region and a peripheral region surrounding the light-emitting region, and the semiconductor structure further comprises:

a first insulator, disposed in the peripheral region, wherein the first insulator extends from the second type semiconductor layer into the first type semiconductor layer, and the first insulator is capable of absorbing the different colors of light emitted by the plurality of light-emitting layers;

a current diffusion layer, disposed on the second type semiconductor layer;

a second insulator, disposed in the light-emitting region, wherein the second insulator extends from the second type semiconductor layer into the light-emitting stack layer, and the second insulator allows the different colors of light emitted by the plurality of light-emitting layers to pass through, the current diffusion layer is a light-transmitting conductive layer, and the current diffusion layer is further disposed on the second insulator; and a light-shielding layer, provided on a part of the light-transmitting conductive layer and exposing the second insulator.

2. The semiconductor structure according to claim 1, wherein a number of the plurality of light-emitting layers is greater than or equal to three.

3. The semiconductor structure according to claim 1, wherein a surface resistance of the first insulator is more than twice of a surface resistance of any one of the first type semiconductor layer, the light-emitting stack layer, and the second type semiconductor layer.

4. The semiconductor structure according to claim 1, wherein the first insulator is formed through ion implantation, ion bombardment, oxidation, or diffusion.

5. The semiconductor structure according to claim 1, wherein a thickness of the second insulator is less than a sum of thicknesses of the second type semiconductor layer and the light-emitting stack layer.

6. The semiconductor structure according to claim 1, wherein a surface resistance of the second insulator is 1.5 times or more of a surface resistance of any one of the light-emitting stack layer and the second type semiconductor layer.

7. The semiconductor structure according to claim 1, wherein the second insulator is formed through ion implantation, ion bombardment, or oxidation.

8. The semiconductor structure according to claim 1, further comprising:

a reflective layer, disposed between the substrate and the first type semiconductor layer.

9. The semiconductor structure according to claim 1, wherein the semiconductor structure has a plurality of light-emitting regions, and the second insulator is disposed in one of the plurality of light-emitting regions.

10. The semiconductor structure according to claim 1, wherein the semiconductor structure comprises a plurality of second insulators, and the light-emitting region is provided with the plurality of second insulators.

11. The semiconductor structure according to claim 10, wherein the plurality of second insulators have different thicknesses.

12. A semiconductor structure, comprising:

a substrate;

a first type semiconductor layer, disposed on the substrate;

a light-emitting stack layer, comprising a plurality of light-emitting layers stacked on the first type semiconductor layer, wherein the plurality of light-emitting layers are configured to emit different colors of light, and wavelengths of the different colors of light fall within a range of 200 nm to 2000 nm; and a second type semiconductor layer, disposed on the light-emitting stack layer, wherein the semiconductor structure has a light-emitting region and a peripheral region surrounding the light-emitting region, and the semiconductor structure further comprises:

a first insulator, disposed in the peripheral region, wherein the first insulator extends from the second type semiconductor layer into the first type semiconductor layer, and the first insulator is capable of absorbing the different colors of light emitted by the plurality of light-emitting layers;

a current diffusion layer, disposed on the second type semiconductor layer;

a second insulator, disposed in the light-emitting region, wherein the second insulator extends from the second type semiconductor layer into the light-emitting stack layer, and the second insulator allows the different colors of light emitted by the plurality of light-emitting layers to pass through, wherein the current diffusion layer is a light-shielding conductive layer, and the current diffusion layer exposes the second insulator.

* * * * *